United States Patent
Fujidai et al.

(10) Patent No.: US 6,762,650 B2
(45) Date of Patent: Jul. 13, 2004

(54) HIGH-FREQUENCY OSCILLATION CIRCUIT, HIGH-FREQUENCY MODULE, AND COMMUNICATION APPARATUS

(75) Inventors: Masanori Fujidai, Yokohama (JP); Hiroshi Nishida, Yokohama (JP); Takahiro Baba, Yokohama (JP); Koichi Sakamoto, Yokohama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 10/261,785

(22) Filed: Oct. 2, 2002

(65) Prior Publication Data

US 2003/0062962 A1 Apr. 3, 2003

(30) Foreign Application Priority Data

Oct. 3, 2001 (JP) ........................................ 2001-307880

(51) Int. Cl.[7] .............................. H03B 5/06; H03B 5/12; H03B 5/18; H03L 1/00
(52) U.S. Cl. ............................ 331/117 FE; 331/108 D; 331/117 R; 331/117 D
(58) Field of Search .................... 331/108 C, 108 D, 331/116 R, 116 FE, 117 R, 117 FE, 117 D, 175

(56) References Cited

U.S. PATENT DOCUMENTS

| 4,310,809 | A | | 1/1982 | Buck et al. | |
|---|---|---|---|---|---|
| 4,707,669 | A | * | 11/1987 | Mekata et al. | ................. 331/99 |
| 4,728,908 | A | * | 3/1988 | Gonda | ..................... 331/108 R |
| 4,736,454 | A | | 4/1988 | Hirsch | |
| 5,463,360 | A | * | 10/1995 | Buoli et al. | .................... 331/96 |
| 6,046,668 | A | | 4/2000 | Forster | |

FOREIGN PATENT DOCUMENTS

| EP | 0 480 494 A1 | 4/1992 |
|---|---|---|
| JP | 7-86832 | 3/1995 |

* cited by examiner

Primary Examiner—David Mis
(74) Attorney, Agent, or Firm—Dickstein, Shapiro, Morin & Oshinsky, LLP.

(57) ABSTRACT

A high-frequency oscillation circuit includes a resonance circuit and an active circuit. The active circuit includes a field-effect transistor and a capacitor. An impedance-conversion circuit including a high-impedance line, a capacitive stub, and a connecting line such as wire, is connected between the active circuit and the resonance circuit. Accordingly, the impedance-conversion circuit can convert the characteristic impedance of the resonance circuit so that the absolute value of the reflection coefficient of the active circuit increases. As a result, the oscillation conditions can be easily fulfilled.

8 Claims, 7 Drawing Sheets

HIGH-FREQUENCY OSCILLATION CIRCUIT, HIGH-FREQUENCY MODULE, AND COMMUNICATION APPARATUS

BACKGROUND OF THE INVENTION

1. Field of the Invention

The present invention relates to a high-frequency oscillation circuit, a high-frequency module, and a communication apparatus for transmitting/receiving high-frequency electromagnetic waves such as microwaves and millimeter waves.

2. Description of the Related Art

Hitherto, a high-frequency oscillation circuit as shown in FIG. 11 has been known. The high-frequency oscillation circuit is used for a communication apparatus or the like and includes a resonance circuit 101 and an active circuit 102 including a field-effect transistor (hereinafter, referred to as FET) for amplifying a signal (for example, Japanese Unexamined Patent Application Publication No. 7-86832). In the known high-frequency oscillation circuit, the resonance circuit 101 is formed by providing a substantially column-shaped dielectric resonator near a microstrip line on a surface of a board and the active circuit 102 is formed by using an amplifier circuit including the FET in which the drain terminal is grounded. Also, the microstrip line and the gate terminal of the FET are connected by wire bonding or bump. Accordingly, the dielectric resonator of the resonance circuit 101 outputs a signal of a predetermined frequency, and the active circuit 102 including the FET amplifies the signal so as to output the signal to a mixer or the like of a communication apparatus through an output terminal 103.

In order that the known high-frequency oscillation circuit may fulfill the oscillation conditions, the product of the absolute value of the reflection coefficient $\Gamma 1$ of the resonance circuit 101 and that of the reflection coefficient $\Gamma 2$ of the active circuit 102 must be 1 or more, as represented by the following expression 1.

$$|\Gamma 1\|\Gamma 2|1 \quad \text{Expression 1}$$

On the other hand, the absolute value of the reflection coefficient $\Gamma 1$ of the resonance circuit 101 is generally less than 1 ($|\Gamma 1|<1$). Therefore, the absolute value of the reflection coefficient $\Gamma 2$ of the active circuit 102 must be more than 1 ($|\Gamma 2|>1$) in order to satisfy the expression 1. However, the impedance of the FET of the active circuit 102 greatly varies in accordance with the frequency of an input signal (for example, the impedance decreases as the frequency of the signal becomes higher). Thus, the absolute value of the reflection coefficient $\Gamma 2$ may decrease in accordance with the frequency of the signal, and the oscillation conditions may not be fulfilled.

Also, since the microstrip line of the resonance circuit 101 and the FET of the active circuit 102 are connected by a wire bonding, the absolute value of the reflection coefficient $\Gamma 2$ of the active circuit 102 may decrease due to the impedance of the wire. Accordingly, it may be difficult to achieve a stable oscillation.

SUMMARY OF THE INVENTION

The present invention has been made in view of the above described problems of the known art, and it is an object of the present invention to provide a high-frequency oscillation circuit in which oscillation conditions can be easily fulfilled and oscillation characteristics can be stabilized, and to provide a high-frequency module and a communication apparatus each comprising the high-frequency oscillation circuit.

In order to solve the above-described problems, a high-frequency oscillation circuit of the present invention comprises a resonance circuit; an active circuit including a field-effect transistor; and an impedance-conversion circuit for increasing the reflection coefficient of the active circuit. The impedance-conversion circuit is provided between the resonance circuit and the active circuit.

With this configuration, the impedance on the output terminal side of the resonance circuit can be converted so that the absolute value of the reflection coefficient of the active circuit increases, and then the converted impedance is connected to the active circuit. Accordingly, the oscillation conditions can be easily fulfilled and the oscillation characteristics can be stabilized.

The impedance-conversion circuit may be connected to the gate terminal of the field-effect transistor. In this case, the active circuit includes an amplifier circuit in which the drain terminal or the source terminal of the FET is grounded.

The impedance-conversion circuit may be formed by a pattern on a circuit board. With this arrangement, the impedance on the output terminal side of the resonance circuit can be easily converted by using the pattern of a microstrip line, etc. provided on the circuit board.

The impedance-conversion circuit may be formed by using an electrode for forming the field-effect transistor. With this arrangement, the impedance on the output terminal side of the resonance circuit can be easily converted by using the electrode of the field-effect transistor.

Alternatively, the impedance-conversion circuit may comprise a high-impedance line, one end thereof being connected to the resonance circuit; a capacitive stub connected to the high-impedance line; and a line for connecting the other end of the high-impedance line to the field-effect transistor.

With this arrangement, an inductive reactance can be set by using the high-impedance line and the connecting line, and a capacitive reactance can be set by using the capacitive stub. By combining the inductive reactance and the capacitive reactance, the impedance on the output terminal side of the resonance circuit can be converted to an impedance so that the absolute value of the reflection coefficient of the active circuit increases. Further, since the impedance-conversion circuit includes the connecting line, the variation in the oscillation characteristics caused by the connecting line can be absorbed by the impedance-conversion circuit, and thus the oscillation characteristics can be stabilized.

Alternatively, the impedance-conversion circuit may comprise a high-impedance line, one end thereof being connected to the resonance circuit; and a line for connecting the other end of the high-impedance line to the field-effect transistor.

With this arrangement, an inductive reactance can be set by using the high-impedance line and the connecting line. Accordingly, the impedance-conversion circuit can vary the phase of the impedance on the output terminal side of the resonance circuit. That is, the impedance can be adjusted to a low impedance which is approximate to the gate impedance of the FET. Further, since the impedance-conversion circuit includes the connecting line, the effect of the oscillation characteristics caused by the connecting line can be absorbed by the impedance-conversion circuit, and thus the oscillation characteristics can be stabilized.

In addition, a high-frequency module and a communication apparatus can be formed by using the high-frequency oscillation circuit according to the present invention.

DESCRIPTION OF THE PREFERRED EMBODIMENTS

Figure 1:
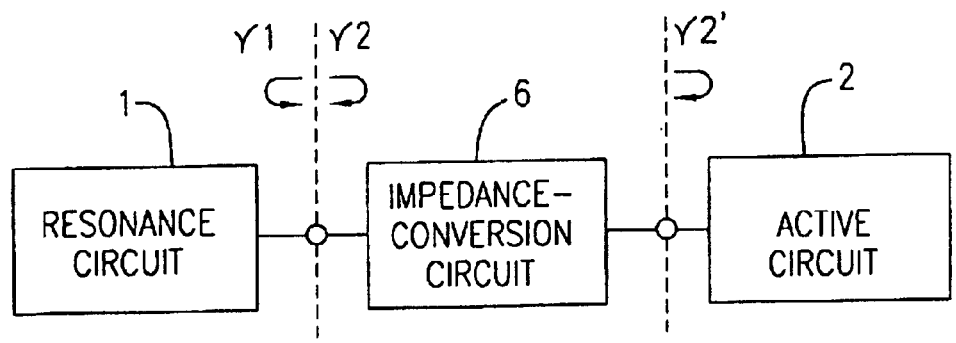
FIG. 1 is a block diagram showing a high-frequency oscillation circuit according to a first embodiment.
Figure 2:
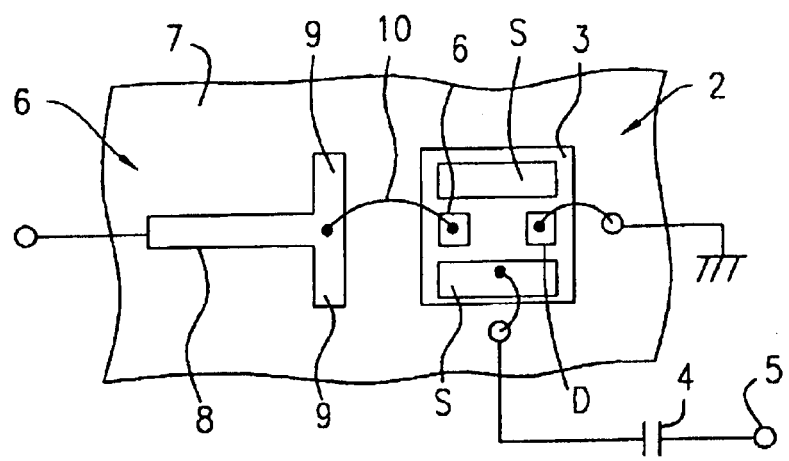
FIG. 2 is a plan view showing the high-frequency oscillation circuit according to the first embodiment.
Figure 3:
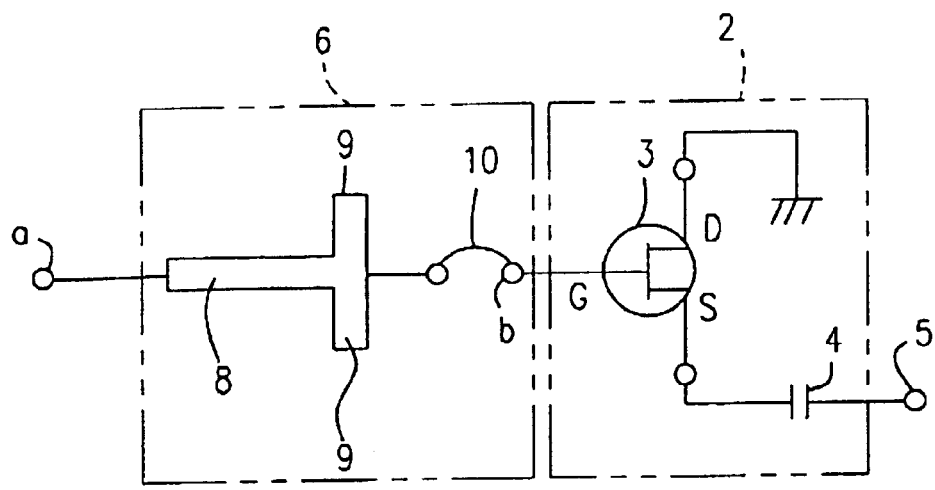
FIG. 3 is an electrical circuit diagram showing the high-frequency oscillation circuit according to the first embodiment.

Hereinafter, a high-frequency oscillation circuit according to embodiments of the present invention will be described in detail with reference to the drawings.

FIGS. 1 to 7 show a high-frequency oscillation circuit according to a first embodiment. In the figures, the high-frequency oscillation circuit includes a resonance circuit 1 including, for example, a dielectric resonator and a microstrip line, as in the known art. In the resonance circuit 1, the dielectric resonator resonates a signal of a predetermined frequency (for example, 30 GHz), such as a microwave or a millimeter wave. The signal is output through the microstrip line to an active circuit 2, which will be described later, when the dielectric resonator and the microstrip line are electromagnetically coupled.

The active circuit 2 is connected to the resonance circuit 1 through an impedance-conversion circuit 6, which will be described later. The active circuit 2 includes a FET 3 having electronic components and a capacitor 4. The drain terminal D of the FET 3 is grounded and the source terminal S thereof is connected to an output terminal 5 through the capacitor 4. Further, the gate terminal G is connected to the impedance-conversion circuit 6.

The impedance-conversion circuit 6 is connected between the resonance circuit 1 and the active circuit 2 and includes a high-impedance line 8 formed by a microstrip line or the like extending linearly on a surface of a circuit board 7, two capacitive stubs 9 which are perpendicular to the high-impedance line 8 and whose ends include an open stub or the like, and a connecting line 10 for connecting the high-impedance line 8 and the gate terminal G of the FET 3, the connecting line 10 including a wire, ribbon, or bump.

Herein, each of the high-impedance line 8 and the capacitive stubs 9 is preferably formed by a conductor pattern having a width of about 0.1 to 0.3 mm and a length of about 0.5 to 2 mm formed on the circuit board 7. The impedance-conversion circuit 6 converts a characteristic impedance Za (for example, Za=50Ω) of the resonance circuit 1 to an impedance Zb (for example, Zb=20Ω) so that the reflection coefficient Γ2' of the active circuit 2 increases.

The high-frequency oscillation circuit according to the first embodiment has the above-described configuration. Next, a method of setting the impedance-conversion circuit 6 will be described with reference to FIGS. 4 to 7.

Figure 4:
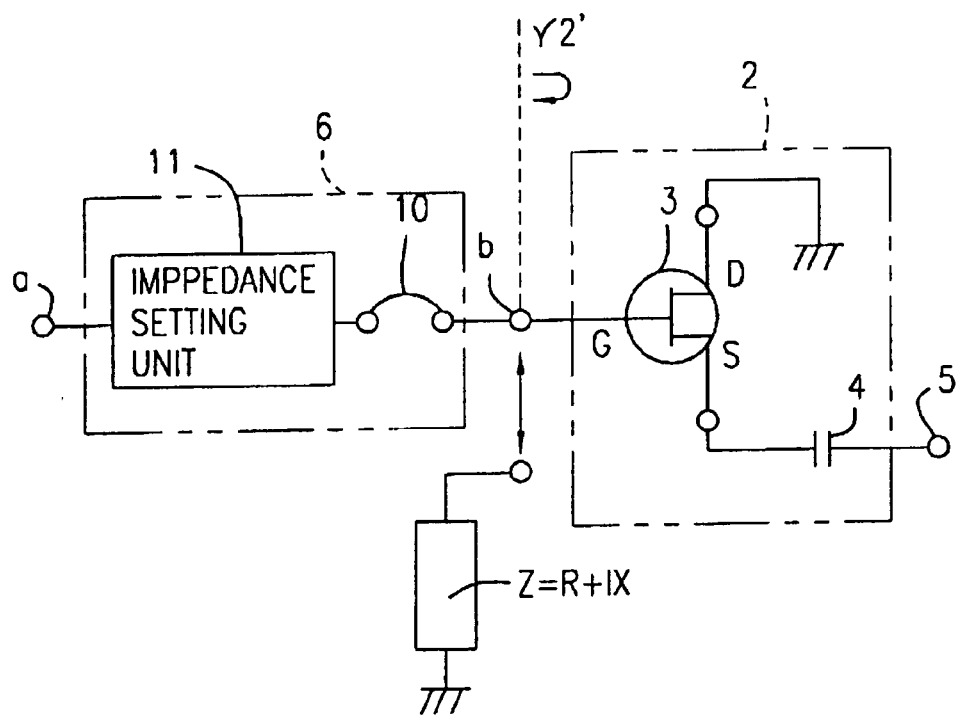
FIG. 4 is an electrical circuit diagram showing the impedance-conversion circuit and the active circuit shown in FIG. 1.
Figure 5:
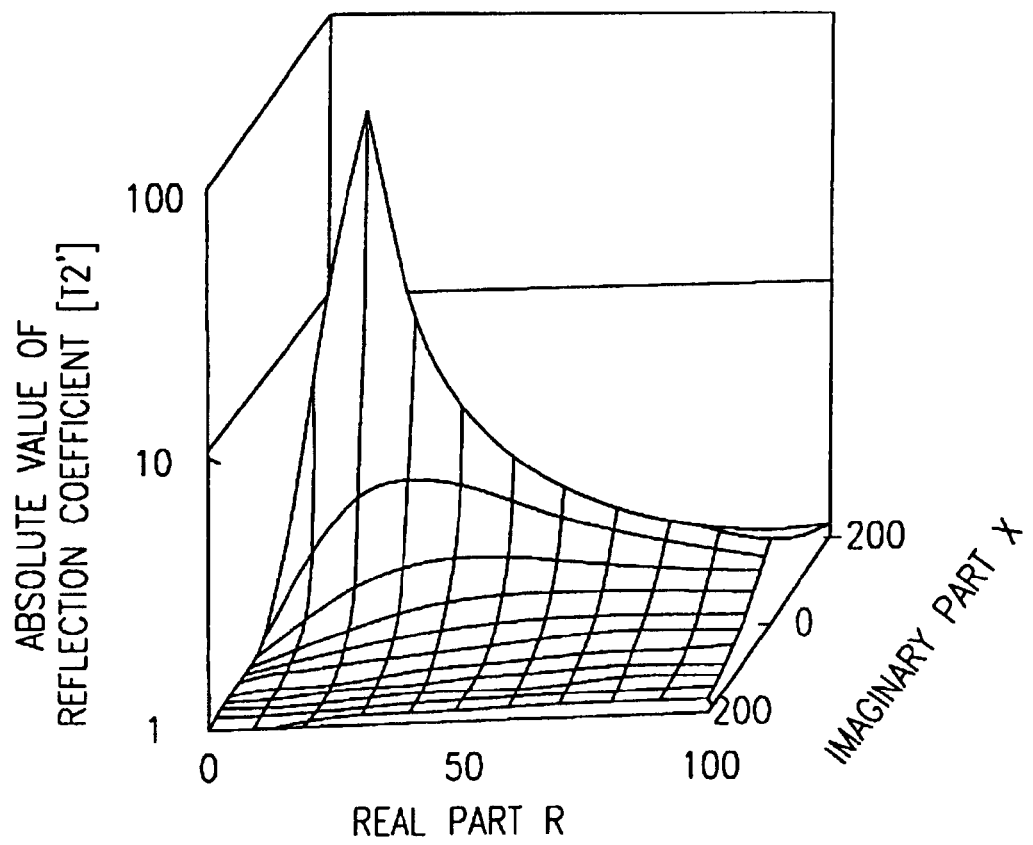
FIG. 5 is a characteristic distribution diagram showing the absolute value of the reflection coefficient of the active circuit when an arbitrary impedance is connected to a gate terminal.
Figure 6:
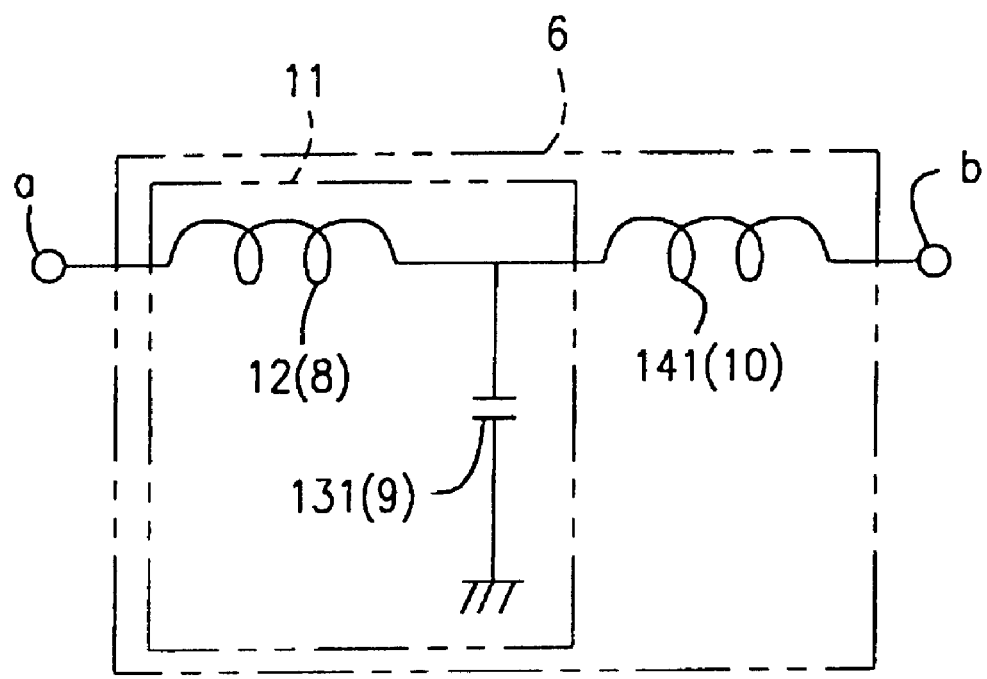
FIG. 6 is an electrical circuit diagram showing an equivalent circuit of the impedance-conversion circuit shown in FIG. 1.
Figure 7:
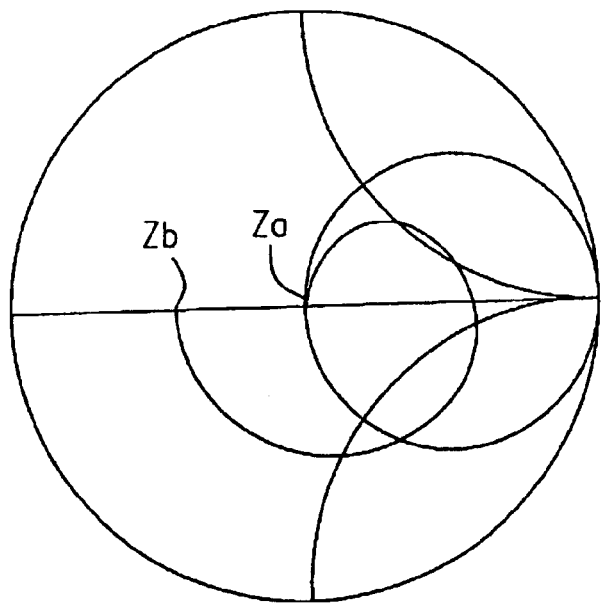
FIG. 7 is a Smith chart showing the both-side impedance of the impedance-conversion circuit.

First, a case where an arbitrary impedance Z (Z=R+jX) including a real part R and an imaginary part X is connected to the active circuit 2, as shown in FIG. 4, is assumed. Then, in this state, the reflection coefficient Γ2' of the active circuit 2 with respect to a signal of a predetermined frequency (30 GHz, for example) is calculated by simulation or the like. As a result, as shown in FIG. 5, a characteristic distribution diagram of the absolute value of the reflection coefficient Γ2' with respect to the arbitrary impedance can be obtained. It can be understood from the diagram that the reflection coefficient is maximized when the impedance Z is 20Ω+j0. Accordingly, the absolute value of the reflection coefficient Γ2' of the active circuit 2 can be maximized by converting the characteristic impedance (50Ω, for example) of the resonance circuit 1 to 20Ω by using the impedance-conversion circuit 6 so as to connect the impedance to the active circuit 2.

As shown in FIG. 4, the impedance-conversion circuit 6 includes an impedance setting unit 11 and the connecting line 10 for connecting the impedance setting unit 11 to the gate terminal G of the FET, in consideration of variation in the impedance caused by the connecting line 10 such as a wire.

The connecting line 10 functions as an inductive reactance element. Accordingly, as shown in the equivalent circuit of FIG. 6, an L-shaped circuit including an inductor 12 and a capacitor 13 is formed as the impedance setting unit 11. Further, the impedance setting unit 11 is connected to an inductor 14 formed by the connecting line 10 so as to form a T-shaped circuit. With this configuration, by adequately setting the inductor 12 and the capacitor 13 of the impedance setting unit 11, the impedance on the output terminal side of the resonance circuit 1 can be converted to a desired value.

Since the high-impedance line 8 forms the inductor 12 and the capacitive stubs 9 form the capacitor 13, the inductor 12 and the capacitor 13 can be adjusted by adequately setting the width and length of the high-impedance line 8 and the capacitive stubs 9. As a result, as shown in the Smith chart of FIG. 7, the impedance Zb of a terminal b of the impedance-conversion circuit 6 can be set to about 20Ω even when the impedance Za of about 50Ω on the output terminal side of the resonance circuit 1 is connected to a terminal a of the impedance-conversion circuit 6. That is, the impedance can be converted between the terminals a and b.

In the high-frequency oscillation circuit according to the first embodiment, the impedance-conversion circuit 6 is set by using the above-described setting method. The operation of the high-frequency oscillation circuit is substantially the same as in the known art. That is, the resonance circuit 1 outputs a signal of a predetermined frequency and the active circuit 2 including the FET 3 amplifies the signal so as to output the signal from the output terminal 5.

In the first embodiment, the impedance-conversion circuit 6 is connected between the resonance circuit 1 and the active circuit 2. Therefore, the characteristic impedance Za of the resonance circuit 1 can be converted to the impedance Zb by using the impedance-conversion circuit 6 so that the absolute value of the reflection coefficient Γ2' of the active circuit 2 increases. As a result, since the absolute value of the reflection coefficient Γ2 of the impedance-conversion circuit 6 with respect to the resonance circuit 1 can be adjusted by using the impedance-conversion circuit 6. The absolute value |Γ2| of the reflection coefficient Γ2 is about 3.0 when the impedance-conversion conversion circuit 6 is not provided as in the known art. On the other hand, the absolute value |Γ2| can be increased to about 13.2 when the impedance-conversion circuit 6 is provided.

With this configuration, the oscillation conditions can be easily fulfilled and the oscillation characteristic can be stabilized. Further, if the oscillation conditions cannot be fulfilled when the impedance-conversion circuit 6 is not provided, the absolute value of the reflection coefficient Γ2 of the impedance-conversion circuit 6 can be increased by providing the impedance-conversion circuit 6 so as to fulfill the oscillation conditions.

Since the impedance-conversion circuit 6 is connected to the gate terminal G of the FET 3, the active circuit 2 can form an amplifier circuit in which the drain terminal D or the source terminal S of the FET 3 is grounded.

Also, since the impedance-conversion circuit 6 includes the high-impedance line 8 and the capacitive stubs 9 which are provided on the circuit board 7 and which form a pattern, the impedance Za on the output terminal side of the resonance circuit 1 can be easily converted by using the pattern of the microstrip line, etc. provided on the circuit board 7.

Further, since the impedance-conversion circuit 6 includes the high-impedance line 8, the capacitive stubs 9, and the connecting line 10, the inductive reactance can be set by using the high-impedance line 8 and the connecting line 10, and the capacitive reactance can be set by using the capacitive stubs 9. By combining the inductive reactance and the capacitive reactance, the impedance Za on the output terminal side of the resonance circuit 1 can be converted to the impedance Zb so that the absolute value of the reflection coefficient Γ2' of the active circuit 2 increases.

Still further, since the impedance-conversion circuit 6 includes the connecting line 10, the impedance-conversion circuit 6 can be formed in consideration of the effect of the connecting line 10. Accordingly, the variation in the absolute value of the reflection coefficient Γ2' of the active circuit 2 caused by the connecting line 10 can be absorbed by the impedance-conversion circuit 6, and thus the oscillation characteristics can be stabilized.

Figure 8:
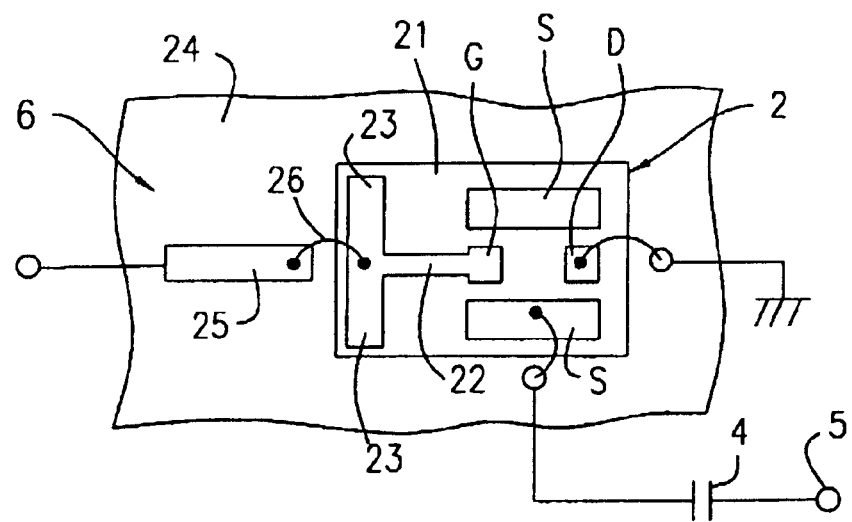
FIG. 8 is a plan view showing a high-frequency oscillation circuit according to a second embodiment.

FIG. 8 shows a high-frequency oscillation circuit according to a second embodiment of the present invention. The second embodiment is characterized in that a high-impedance line and capacitive stubs forming part of the impedance-conversion circuit are formed by using electrodes of an FET. In the second embodiment, elements which are the same as those in the first embodiment are denoted by the same reference numerals, and the corresponding description will be omitted.

In the second embodiment, the impedance-conversion circuit 6 includes an FET 21 formed as a single chip component. Electrodes forming a source terminal S, a drain terminal D, and a gate terminal G are formed on the surface of the FET 21. Also, a high-impedance line 22 extending outward is connected to the gate terminal G, which is preferably located at the center of the FET 21. Further, two capacitive stubs 23 are provided at one end of the high-impedance line 22. Accordingly, the gate terminal G, the high-impedance line 22, and the capacitive stubs 23 preferably form a substantially T-shaped electrode.

The FET 21 is provided on the surface of a circuit board 24. Also, another high-impedance line 25 which includes a microstrip line is formed on the circuit board 24. One end of the high-impedance line 25 is connected to the resonance circuit (not shown), and the other end thereof is connected to the gate electrode G via a connecting line 26 such as a bonding wire. The high-impedance lines 22 and 25, the capacitive stubs 23, and the connecting line 26 form the impedance-conversion circuit 6.

In the second embodiment, the same function and advantage as those of the first embodiment can be obtained. Further, in the second embodiment, the capacitive stubs 23 forming part of the impedance-conversion circuit 6 are formed by the electrodes of the FET 21, and thus the impedance Za on the output terminal side of the resonance circuit can be easily converted to a desired impedance Zb by using the electrodes provided in the FET 21.

In the second embodiment, the high-impedance line 25 is provided on the circuit board 24. However, this high-impedance line 25 is not necessary to form the impedance-conversion circuit 6.

Figure 9:
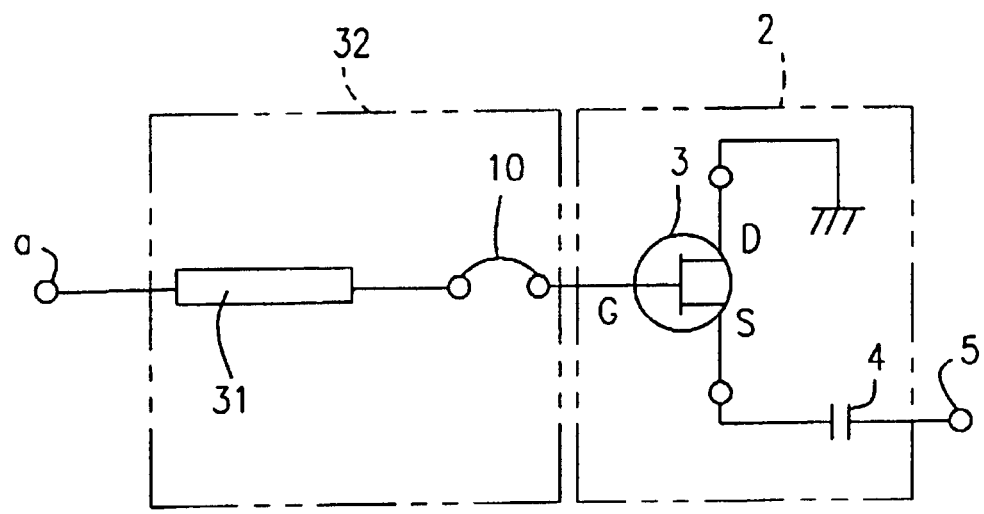
FIG. 9 is an electrical circuit diagram showing a high-frequency oscillation circuit according to a third embodiment.
Figure 11:
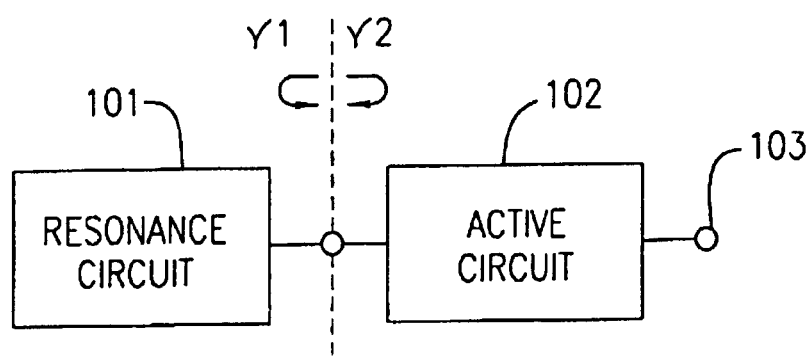
FIG. 11 is a block diagram showing a high-frequency oscillation circuit according to the prior art.

FIG. 9 shows a high-frequency oscillation circuit according to a third embodiment of the present invention. The third embodiment is characterized in that the impedance-conversion circuit includes a high-impedance line and a connecting line. In the third embodiment, elements which are the same as those in the first embodiment are denoted by the same reference numerals, and the corresponding description will be omitted.

In the third embodiment, an impedance-conversion circuit 32 includes a high-impedance line 31. One end of the high-impedance line 31 is connected to the resonance circuit (not shown), and the other end thereof is connected to the gate terminal G of the FET 3 through the connecting line 10. Accordingly, the high-impedance line 31 and the connecting line 10 form the impedance-conversion circuit 32.

In the third embodiment, the same function and advantage as those of the first embodiment can be obtained. Further, in the third embodiment, the impedance-conversion circuit 32 includes the high-impedance line 31 and the connecting line 10, which form an inductive reactance, and a capacitive reactance is not provided. Therefore, the impedance-conversion circuit 32 can vary the phase of the characteristic impedance Za on the output terminal side of the resonance circuit. That is, the impedance-conversion circuit 32 can adjust the impedance Za to a low impedance which is approximate to the gate impedance of the FET 3.

Figure 10:
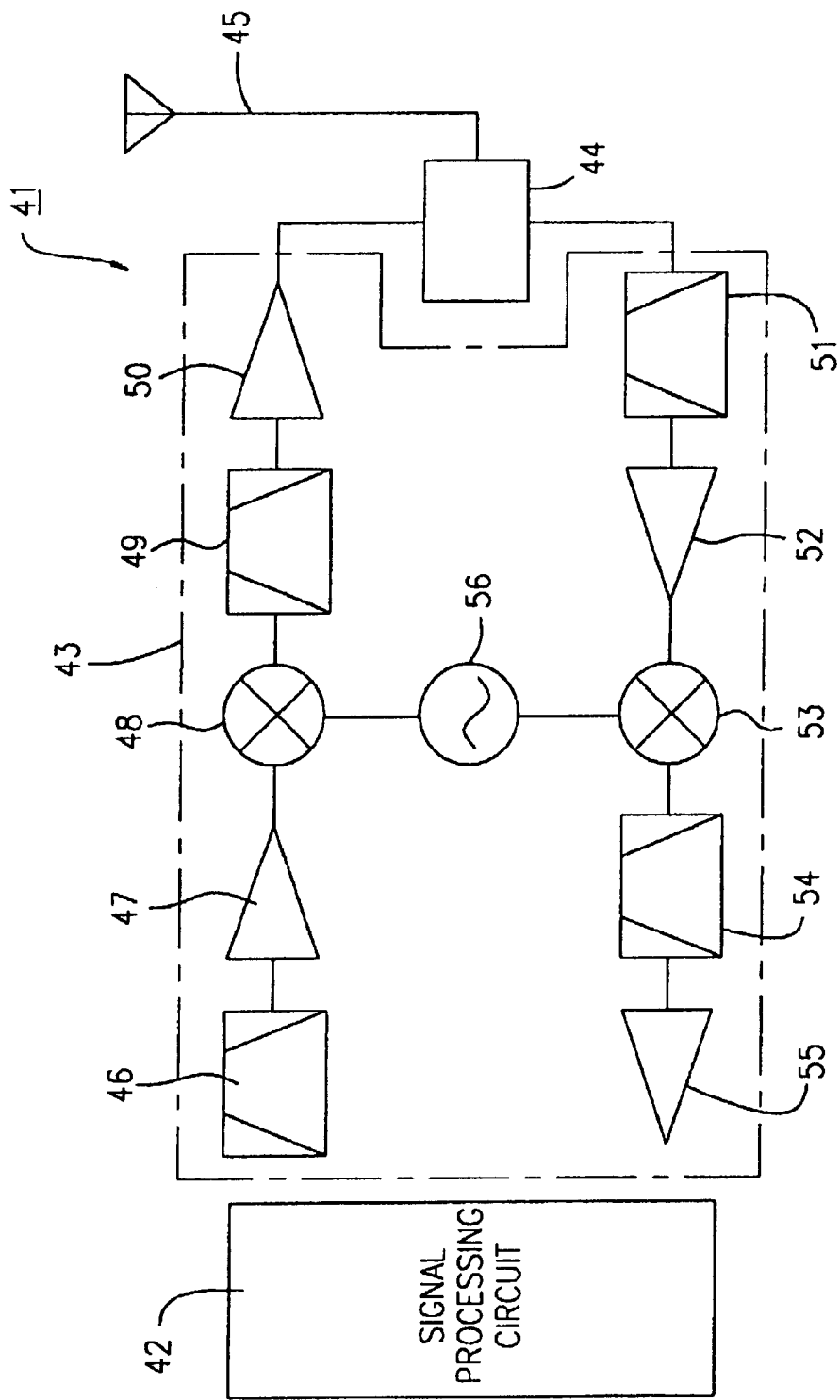
FIG. 10 is a block diagram showing a communication apparatus according to an aspect of the present invention.

FIG. 10 shows a high-frequency module and a communication apparatus formed by using the high-frequency oscillation circuit.

A communication apparatus 41 according to the present invention preferably includes a signal processing circuit 42, a high-frequency module 43 which is connected to the signal processing circuit 42 and which outputs/inputs a high-frequency signal, an antenna duplexer 44, and an antenna 45 which is connected to the high-frequency module 43 and which transmits/receives the high-frequency signal through the antenna duplexer 44.

Further, the transmission side of the high-frequency module 43 preferably includes a band-pass filter 46, an amplifier 47, a mixer 48, a band-pass filter 49, and a power amplifier 50, which are connected between the output side of the signal processing circuit 42 and the antenna duplexer 44.

Also, the reception side thereof preferably includes a band-pass filter 51, a low-noise amplifier 52, a mixer 53, a band-pass filter 54, and an amplifier 55, which are connected between the antenna duplexer 44 and the input side of the signal processing circuit 42. In addition, a high-frequency oscillation circuit 56, which is one of high-frequency oscillation circuits according to the first to third embodiments, is preferably connected between the mixers 48 and 53.

The communication apparatus according to the present invention has the above-described configuration. Hereinafter, the operation thereof will be described.

When a signal is transmitted, an intermediate-frequency signal (IF signal) output from the signal processing circuit 42 is input to the band-pass filter 46, where an unnecessary component of the signal is removed, is amplified by the amplifier 47, and then is input to the mixer 48. At this time, the mixer 48 mixes the IF signal with the carrier from the high-frequency oscillation circuit 56 so as to upconvert the signal to a radio-frequency (RF) signal. The RF signal output from the mixer 48 is input to the band-pass filter 49, where an unnecessary component of the signal is removed, is amplified to a transmission power by the power amplifier 50, and then is transmitted from the antenna 45 through the antenna duplexer 44.

On the other hand, when a signal is received, an RF signal received by the antenna 45 is input to the band-pass filter 51 through the antenna duplexer 44. Then, an unnecessary component of the RF signal is removed by the band-pass filter 51, and the RF signal is amplified by the low-noise amplifier 52 and is input to the mixer 53. At this time, the mixer 53 mixes the RF signal with the carrier from the high-frequency oscillation circuit 56 so as to downconvert the signal to an IF signal. Then, the IF signal output from the mixer 53 is input to the band-pass filter 54, where an unnecessary component of the signal is removed, is amplified by the amplifier 55, and then is input to the signal processing circuit 42.

The communication apparatus can be formed by using the high-frequency oscillation circuit 56 having stabilized oscillation characteristics. Accordingly, reliability of the communication apparatus can be enhanced.

As described above, the high-frequency oscillation circuit according to the present invention is applied to the communication apparatus. However, the high-frequency oscillation circuit can be applied to a radar or the like.

Also, in the foregoing embodiments, the impedance-conversion circuit 6 or 32 is connected to the gate terminal G of the FET 3. However, when an amplifier circuit in which the gate of the FET is grounded is used as the active circuit, the impedance-conversion circuit may be connected to the source terminal S or the drain terminal D of the FET.

Further, in the foregoing embodiments, the resonance circuit 1 includes the dielectric resonator and the microstrip line. However, various types of resonators and transmission lines can be used. Also, in the foregoing embodiments, the active circuit 2 includes the FET 3 and the capacitor 4. However, the active circuit may include various types of amplifier circuits including an FET.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high-frequency oscillation circuit comprising:

a resonance circuit;

an active circuit including a field-effect transistor; and an impedance-conversion circuit for increasing a reflection coefficient of the active circuit, wherein the impedance-conversion circuit is provided between the resonance circuit and the active circuit.

2. The high-frequency oscillation circuit according to claim 1, wherein the impedance-conversion circuit is connected to a gate terminal of the field-effect transistor.

3. The high-frequency oscillation circuit according to claim 1, wherein the impedance-conversion circuit is formed by a pattern on a circuit board.

4. The high-frequency oscillation circuit according to claim 2, wherein the impedance-conversion circuit is formed by using an electrode of the field-effect transistor.

5. The high-frequency oscillation circuit according to claim 1, wherein the impedance-conversion circuit comprises a high-impedance line having a first end thereof connected to the resonance circuit; a capacitive stub connected to the high-impedance line; and a line connecting a second end of the high-impedance line to the field-effect transistor.

6. The high-frequency oscillation circuit according to claim 1, wherein the impedance-conversion circuit comprises a high-impedance line having a first end thereof connected to the resonance circuit; and a line connecting a second end of the high-impedance line to the field-effect transistor.

7. A high-frequency module comprising the high-frequency oscillation circuit according to claim 1.

8. A communication apparatus comprising the high-frequency oscillation circuit according to claim 1.

* * * * *